(12) United States Patent
Shiu et al.

(10) Patent No.: US 10,510,584 B2
(45) Date of Patent: Dec. 17, 2019

(54) VIA PATTERNING USING MULTIPLE PHOTO MULTIPLE ETCH

(71) Applicant: Taiwan Semiconductor Manufacturing Company, Ltd., Hsinchu (TW)

(72) Inventors: Jung-Hau Shiu, New Taipei (TW); Chung-Chi Ko, Nantou (TW); Tze-Liang Lee, Hsinchu (TW); Wen-Kuo Hsieh, Taipei (TW); Yu-Yun Peng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/458,816

(22) Filed: Jul. 1, 2019

(65) Prior Publication Data

US 2019/0326164 A1 Oct. 24, 2019

Related U.S. Application Data (63) Continuation of application No. 16/199,847, filed on Nov. 26, 2018, now Pat. No. 10,340,178, which is a
(Continued)

(51) Int. Cl.
*H01L 21/768* (2006.01)
*H01L 21/033* (2006.01)
(Continued)

(52) U.S. Cl.
CPC .... *H01L 21/76811* (2013.01); *H01L 21/0332* (2013.01); *H01L 21/0335* (2013.01);
(Continued)

(58) Field of Classification Search
CPC ......... H01L 21/02109; H01L 21/02436; H01L 21/70; H01L 21/702; H01L 21/71
See application file for complete search history.

(56) References Cited

U.S. PATENT DOCUMENTS 6,853,043 B2   2/2005   Yeh et al.
8,916,337 B2  12/2014   Arnold et al.
(Continued)

FOREIGN PATENT DOCUMENTS

JP  2011100765 A  5/2011
KR  20060049990 A  5/2006

OTHER PUBLICATIONS

Kolari, K. "High etch selectivity for plasma etching SiO2 with AlN and Al2O3 masks," www.sciencedirect.com, Microelectronic Engineering, 85, Jan. 2008, pp. 985-987.
(Continued)

*Primary Examiner* — Cheung Lee
(74) *Attorney, Agent, or Firm* — Slater Matsil, LLP (57) ABSTRACT

A method includes forming a dielectric layer, forming a photo resist over the dielectric layer, forming a first mask layer over the photo resist, and forming a second mask layer over the first mask layer. A first-photo-first-etching is performed to form a first via pattern in the second mask layer, wherein the first-photo-first-etching stops on a top surface of the first mask layer. A second-photo-second-etching is performed to form a second via pattern in the second mask layer, wherein the second-photo-second-etching stops on the top surface of the first mask layer. The first mask layer is etched using the second mask layer as an etching mask. The photo resist and the dielectric layer are etched to simultaneously transfer the first via pattern and the second via pattern into the dielectric layer.

20 Claims, 8 Drawing Sheets

Related U.S. Application Data continuation of application No. 15/693,949, filed on Sep. 1, 2017, now Pat. No. 10,141,220, which is a continuation of application No. 15/226,199, filed on Aug. 2, 2016, now Pat. No. 9,754,818, which is a continuation of application No. 14/992,515, filed on Jan. 11, 2016, now Pat. No. 9,412,648.

(51) Int. Cl.
*H01L 23/532* (2006.01)
*H01L 23/522* (2006.01)
*H01L 21/311* (2006.01)

(52) U.S. Cl.
CPC .... *H01L 21/0337* (2013.01); *H01L 21/31144* (2013.01); *H01L 21/76802* (2013.01); *H01L 21/76816* (2013.01); *H01L 21/76831* (2013.01); *H01L 21/76877* (2013.01); *H01L 23/5226* (2013.01); *H01L 23/5329* (2013.01); *H01L 23/53295* (2013.01); *H01L 23/53238* (2013.01)

(56) References Cited

U.S. PATENT DOCUMENTS

| | | |
|---|---|---|
| 9,754,818 B2 | 9/2017 | Shiu et al. |
| 10,141,220 B2 | 11/2018 | Shiu et al. |
| 2002/0090576 A1 | 7/2002 | Tu |
| 2006/0009025 A1 | 1/2006 | Kanamura |
| 2007/0093057 A1 | 4/2007 | Chen et al. |
| 2012/0129337 A1 | 5/2012 | Chen et al. |
| 2013/0216776 A1 | 8/2013 | Arnold et al. |
| 2015/0380315 A1 | 12/2015 | Chen et al. |

OTHER PUBLICATIONS

Paul, J. et al., "Evaluation of an advanced dual hard mask stack for high resolution pattern transfer," Advanced Etch Technology for Nanopatterning II, Proc. of SPIE, vol. 8685, 86850V-1, http://proceedings.spiedigitallibrary.org/ on Sep. 8, 2015 Terms of Use: http://spiedigitallibrary.org/ss/TermsOfUse.aspx, 11 pages.

Plummer, James D. et al, "Silicon VLSO Technology: Fundamentals, Practice and Modeling," Chapter 10, NE 343: Microfabrication and thin film technology, http://ece/uwaterloo.ca; 23 pages, Jul. 24, 2000.

Yoshio, Nishi et al., "Overview of Interconnect—Copper and Low-k Integration," Handbook of Semiconductor Manufacturing Technology, Second Edition, CRCnetBASE, p. 2-9, Jul. 9, 2007.

VIA PATTERNING USING MULTIPLE PHOTO MULTIPLE ETCH

PRIORITY CLAIM AND CROSS-REFERENCE

This application is continuation of U.S. patent application Ser. No. 16/199,847, entitled "entitled "Via Patterning using Multiple Photo Multiple Etch," filed Nov. 26, 2018, which is a continuation of U.S. patent application Ser. No. 15/693,949, entitled "Via Patterning using Multiple Photo Multiple Etch," filed Sep. 1, 2017, now U.S. Pat. No. 10,141,220 issued Nov. 27, 2018, which is a continuation of U.S. patent application Ser. No. 15/226,199, entitled "Via Patterning using Multiple Photo Multiple Etch," filed on Aug. 2, 2016, now U.S. Pat. No. 9,754,818 issued Sep. 5, 2017, which is a continuation of U.S. patent application Ser. No. 14/992,515, entitled "Via Patterning using Multiple Photo Multiple Etch," filed on Jan. 11, 2016, now U.S. Pat. No. 9,412,648 issued Aug. 9, 2016, which applications are incorporated herein by reference.

BACKGROUND

In order to form the features of integrated circuits on wafers, lithography process is used. A typical lithography process involves applying a photo resist, and defining patterns on the photo resist. The patterns in the patterned photo resist are defined in a lithography mask, and are defined either by the transparent portions or by the opaque portions in the lithography mask. The patterns in the patterned photo resist are then transferred to the underlying features through an etching step, wherein the patterned photo resist is used as an etching mask. After the etching step, the patterned photo resist is removed.

With the increasing down-scaling of integrated circuits, optical proximity effect posts an increasingly greater problem for transferring patterns from lithography mask to wafers. When two separate features are too close to each other, the optical proximity effect may cause the resulting formed features to short to each other. To solve such a problem, double-patterning technology was introduced for enhancing feature density without incurring optical proximity effect. One of the double patterning technologies uses two-patterning-two-etching (2P2E). The closely located features are separated into two lithography masks, with both lithography masks used to expose the same photo resist or two photo resists, so that the closed located patterns may be transferred to a same layer such as a low-k dielectric layer. In each of the double patterning lithography masks, the distances between the features are increased over the distances between the features in the otherwise single patterning mask, and may be practically doubled when necessary. The distances in the double patterning lithography masks are greater than the threshold distances of the optical proximity effect, and hence the optical proximity effect is at least reduced, or substantially eliminated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Multiple patterning method for forming closely located vias in the interconnect structure of integrated circuits is provided in accordance with various exemplary embodiments. The intermediate stages of forming the vias are illustrated. Some variations of some embodiments are discussed. Throughout the various views and illustrative embodiments, like reference numbers are used to designate like elements.

Figure 15:
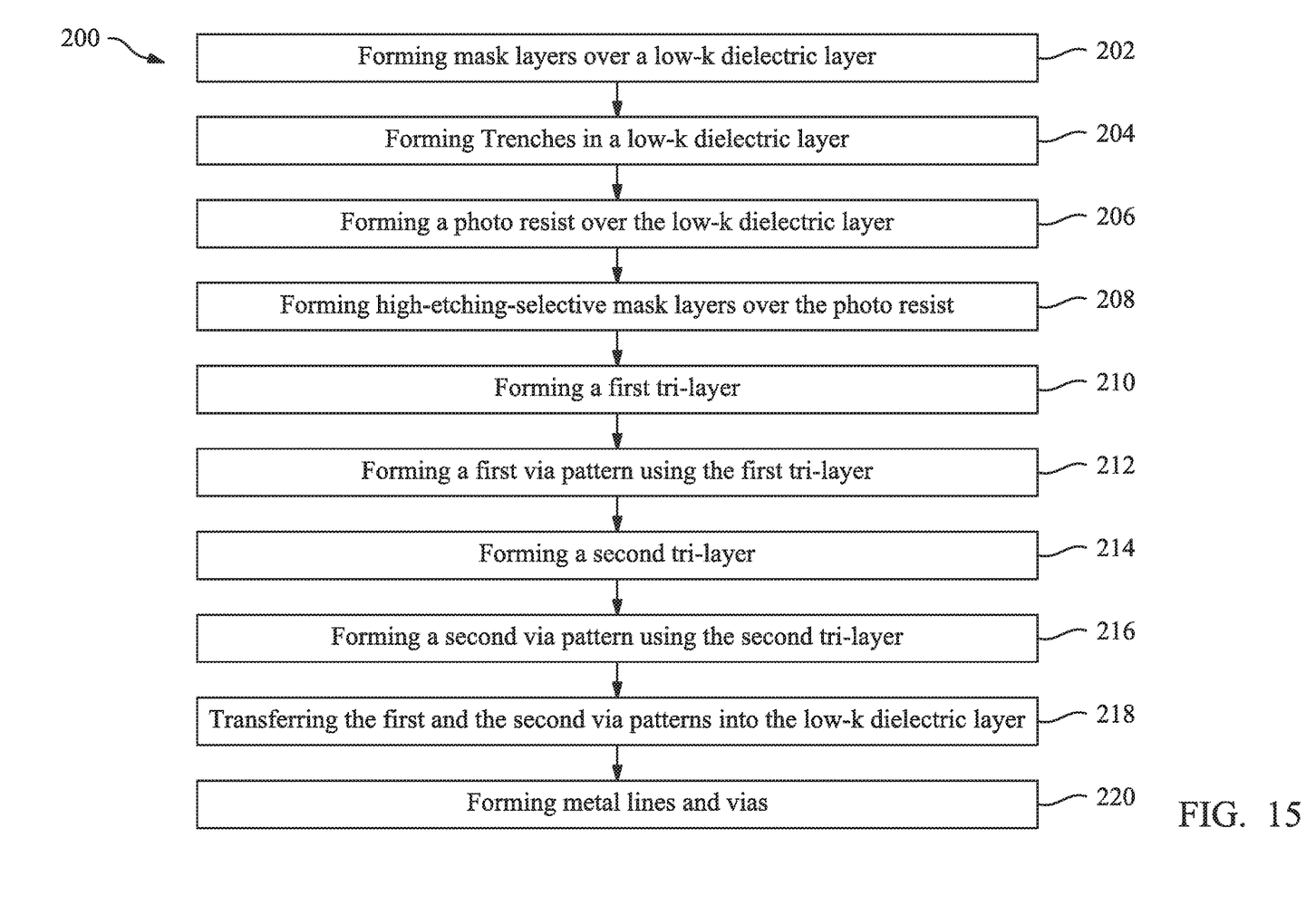
FIG. 15 illustrates a process flow for forming an integrated circuit structure including two vias underlying and connected to respective overlying metal lines in accordance with some embodiments.

FIGS. 1 through 13 illustrate the cross-sectional views of intermediate stages in the formation of vias in accordance with some embodiments. The steps shown in FIGS. 1 through 13 are also illustrated schematically in the process flow 200 shown in FIG. 15. In the subsequent discussion, the process steps shown in FIGS. 1 through 13 are discussed referring to the process steps in FIG. 15.

Figure 1:
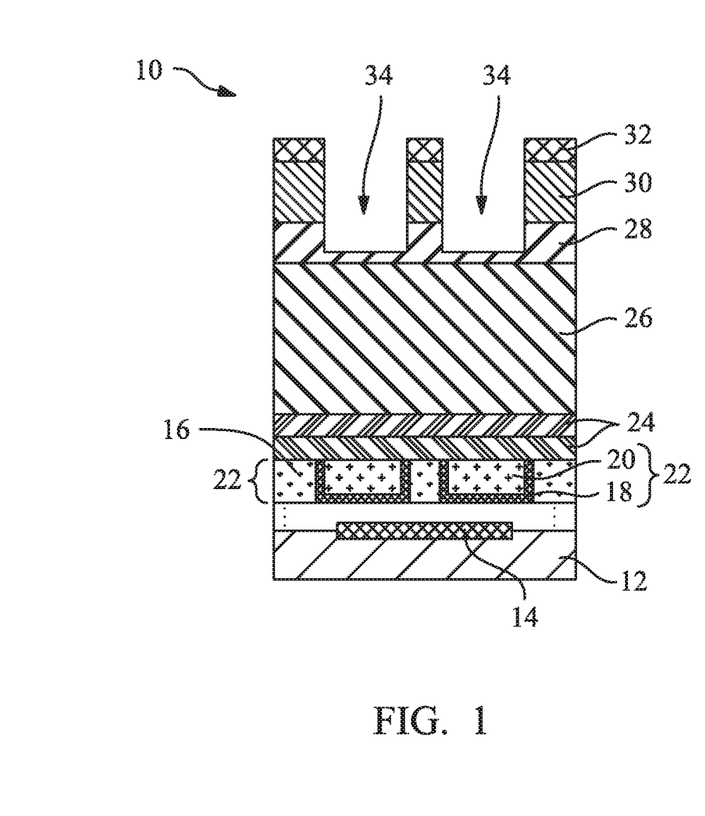
FIGS. 1 through 13 illustrate the cross-sectional views of intermediate stages in the formation of metal lines and the underlying vias in accordance with some embodiments.

FIG. 1 illustrates a cross-sectional view of wafer 10, wherein the illustrated portion is a part of a device die. In accordance with some embodiments of the present disclosure, wafer 10 is a device wafer including active devices such as transistors and/or diodes, and possibly passive devices such as capacitors, inductors, resistors, and/or the like.

In accordance with some embodiments of the present disclosure, wafer 10 includes semiconductor substrate 12 and the features formed at a top surface of semiconductor substrate 12. Semiconductor substrate 12 may comprise crystalline silicon, crystalline germanium, silicon germanium, and/or a III-V compound semiconductor such as GaAsP, AlInAs, AlGaAs, GaInAs, GaInP, GaInAsP, or the like. Semiconductor substrate 12 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 12. Although not shown, through-vias may be formed to extend into semiconductor substrate 12, wherein the through-vias are used to electrically intercouple the features on opposite sides of wafer 10. Active devices 14, which may include transistors therein, are formed at the top surface of substrate 12.

Further illustrated in FIG. 1 is dielectric layer 16, which is alternatively referred to as Inter-Metal Dielectric (IMD) layer 16 hereinafter. In accordance with some embodiments of the present disclosure, IMD layer 16 is formed of a low-k dielectric material having a dielectric constant (k-value) lower than about 3.0, about 2.5, or even lower. IMD layer 16 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of IMD layer 16 includes depositing a porogen-containing dielectric material and then performing a curing process to drive out the porogen, and hence the remaining IMD layer 16 is porous.

Conductive features 22 are formed in IMD 16. In accordance with some embodiments, conductive features 22 are metal lines, which include diffusion barrier layers 18 and copper-containing material 20 over diffusion barrier layers 18. Diffusion barrier layers 18 may include titanium, titanium nitride, tantalum, tantalum nitride, or the like and have the function of preventing copper in copper-containing material 20 from diffusing into IMD 16. Conductive lines 22 are referred to as metal lines 22 hereinafter. Conductive features 22 may have a single damascene structure, a dual damascene structure, and may be contact plugs in some embodiments.

Dielectric layer 24 is formed over dielectric layer 16 and conductive lines 22. Dielectric layer 24 may be used as an Etch Stop Layer (ESL), and hence is referred to as ESL 24 throughout the description. ESL 24 may comprise a nitride, a silicon-carbon based material, a carbon-doped oxide, and/or combinations thereof. The formation methods include Plasma Enhanced Chemical Vapor Deposition (PECVD) or other methods such as High-Density Plasma CVD (HDP-CVD), Atomic Layer CVD (ALCVD), and the like. In accordance with some embodiments, dielectric layer 24 is also used as a diffusion barrier layer for preventing undesirable elements, such as copper, from diffusing into the subsequently formed low-k dielectric layer. ESL 24 may include Carbon-Doped Oxide (CDO), carbon incorporated silicon oxide (SiOC) or Ornithine decarboxylase (ODC). ESL 24 may also be formed of Nitrogen-Doped silicon Carbide (NDC). ESL 24 may be a single layer or may include more than one layer.

Dielectric layer 26 is formed over ESL 24. In accordance with some exemplary embodiments of the present disclosure, dielectric layer 26 is formed of a low-k dielectric material, and is referred to as low-k dielectric layer 26 hereinafter. Low-k dielectric layer 26 may be formed using a material selected from the same candidate materials for forming dielectric layer 16. When selected from the same candidate materials, the materials of dielectric layers 16 and 26 may be the same or different from each other.

In accordance with some embodiments, layers 28, 30, and 32 are formed over low-k dielectric layer 26. The respective step is shown as step 202 in the process flow illustrated in FIG. 15. Anti-Reflective coating Layer (ARL) 28 is formed over low-k dielectric layer 26. ARL 28 may be a Nitrogen-Free ARL (NFARL), which may be formed of an oxide in accordance with some exemplary embodiments. For example, NFARL may include silicon oxide formed using Plasma Enhanced Chemical Vapor Deposition (PECVD).

Mask layer 30 is formed over ARL 28. Mask layer 30 is also referred to as hard mask layer 30 hereinafter. In accordance with some embodiments, hard mask layer 30 comprises a metal(s), which may be in the form of a metal nitride. Hard mask layer 30 may also be formed of a non-metal nitride such as silicon nitride, an oxynitride such as silicon oxynitride, or the like. ARL 32 may be further formed over hard mask layer 30. ARL 32 may also be an NFARL, which may be formed of an oxide, such as silicon oxide formed using PECVD.

ARL 32 and mask layer 30 are patterned to from trenches 34. In accordance with some embodiments, trenches 34 are formed using a two-patterning-two-etching (2P2E) process, wherein two neighboring trenches 34 are formed using different lithography processes, so that neighboring trenches 34 may be located close to each other without incurring optical proximity effect.

Figure 2:
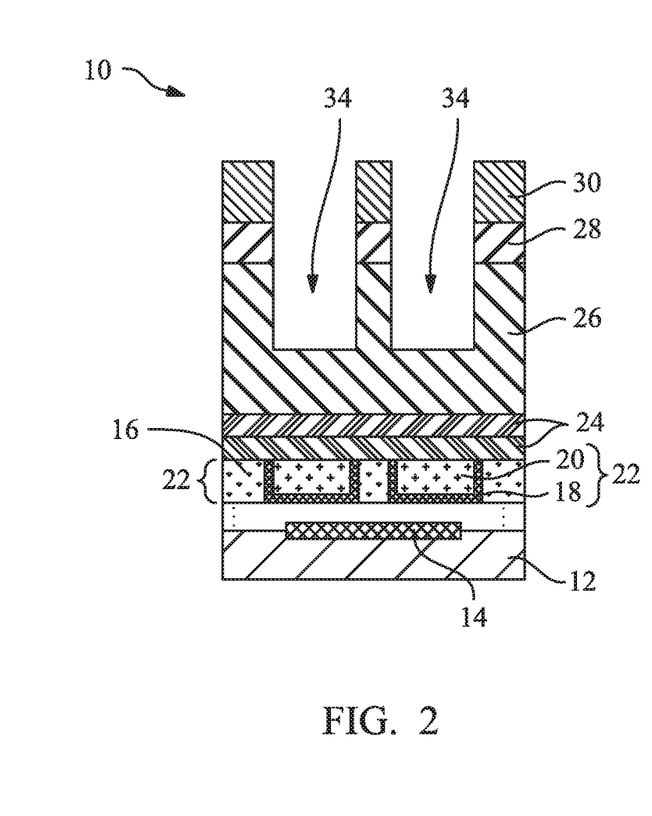

Referring to FIG. 2, the patterned ARL 32 and mask layer 30 are used as an etching mask to etch ARL 28 and low-k dielectric layer 26. Accordingly, trenches 34 extend into low-k dielectric layer 26. The respective step is shown as step 204 in the process flow illustrated in FIG. 15. The etching is finished when the bottom surfaces of trenches 34 are at an intermediate level between the top surface and the bottom surface of low-k dielectric layer 26. During the etching, ARL 32 (FIG. 1) may be consumed, leaving mask layer 30 as a top layer.

Figure 3:
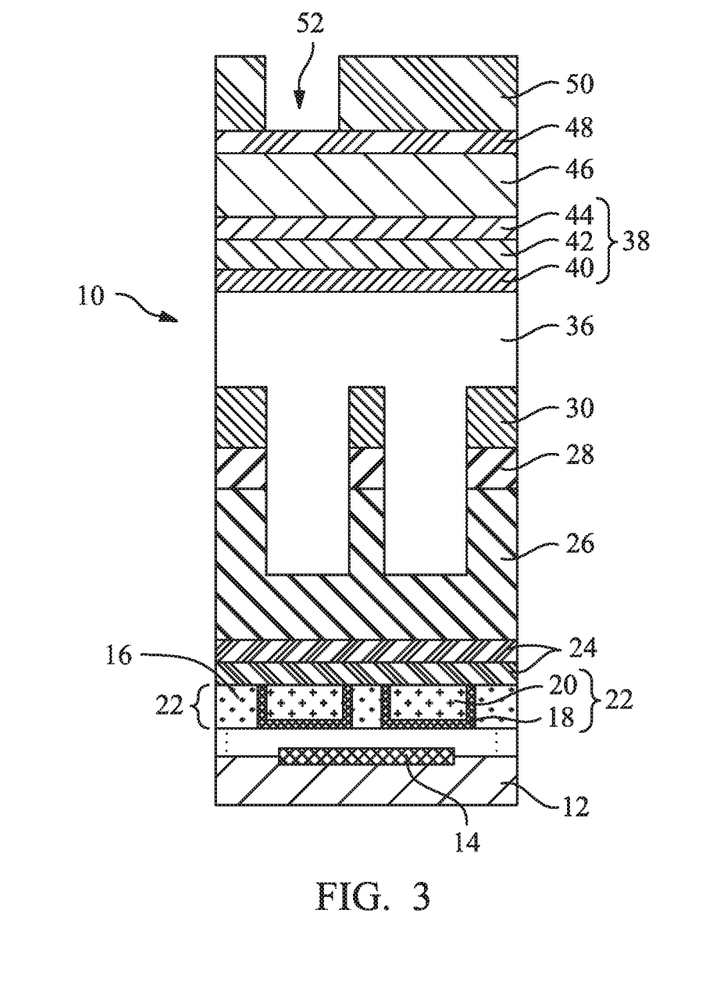

Referring to FIG. 3, photo resist 36 is formed over mask layer 30, and has some portions filled into trenches 34 (FIG. 2). The respective step is shown as step 206 in the process flow illustrated in FIG. 15. Photo resist 36 has a planar top surface, so that the subsequently formed layers overlying photo resist 36 may be planar layers, and may be very thin (for example, with thicknesses of several hundred angstroms) while still being conformal.

Next, high-etching-selective layers 38, which are also referred to as mask layers 38, are formed. The respective step is shown as step 208 in the process flow illustrated in FIG. 15. High-etching-selective layers 38 include at least two layers that have different characteristics, and hence have high etching selectivity when an appropriate etchant is used. In accordance with some embodiments of the present disclosure, layers 38 include layer 40, layer 42 over layer 40, and layer 44 over layer 42. For example, layers 38 include Low-Temperature (LT) oxide layer 40, metal and/or nitride containing layer (such as TiN, AlN, or $Al_2O_3$) 42 over LT oxide layer 40, and LT oxide layer 44 over layer 42. Layer 42 may be used as a hard mask, and LT oxide layer 40 may be used as an etch stop layer in the patterning of mask layer 42 and/or a hard mask in the etching of low-k dielectric layer 26.

In accordance with alternative embodiments, layers 38 include layers 40 and 42, but not layer 44. In accordance with yet alternative embodiments, layers 38 include layers 42 and 44, but not layer 40. Metal nitride layer 42, since containing metal, may have a high etching selectivity with relative to LT oxide layers 40 and 44 when appropriate etchants are selected, so that the etching may result in an overlying layer in layers 38 to be patterned, while an underlying layer in layers 38 is used as an etch stop layer. Due to the existence of photo resist 36, layers 40, 42, and 44 are formed at low temperatures to prevent the damage of photo resist 36. The formation temperatures of layers 40, 42, and 44 may be lower than about 200° C., and may be in the range between about 75° C. and about 170° C. Layer 40, which is formed on photo resist 36, may be formed using Atomic Layer Deposition (ALD) to minimize the damage to photo resist 36 by plasma, while other methods such as Chemical Vapor Deposition (CVD), Physical Vapor Deposition (PVD), or the like may also be used. Layer 42 (such As TiN) may be formed using PVD. The thickness of layers 40, 42, and 44 may be in the range between about 200 Å and about 400 Å.

The materials of layers 40, 42, and 44 may be selected from various combinations. For example, a plurality of etchant groups is listed below, wherein each of the group includes the etchants that are suitable for etching some etchable materials, while some non-etchable materials are also listed. Accordingly, the etchable materials may be used as for forming an overlying layer in layers 38, and the non-etchable materials may be used for forming an immediate underlying layer in layers 38. For example, $H_3PO_4$ or $HNO_3$ is suitable for etching metal (such as aluminum) or SiN, and is not suitable for etching either one of $SiO_2$, Si, and photo resist. $NH_4OH$ or $H_2O_2$ is suitable for etching aluminum or polymers, and is not suitable for etching either one of $SiO_2$, Si, and SiN. The etching may also be performed using dry etching. For example, metals may be etched using $Cl_2$, and dielectric materials may be etched using $C_xF_y$, wherein the flow rates of the process gases may be adjusted to improve selectivity in the etching.

Figure 4:
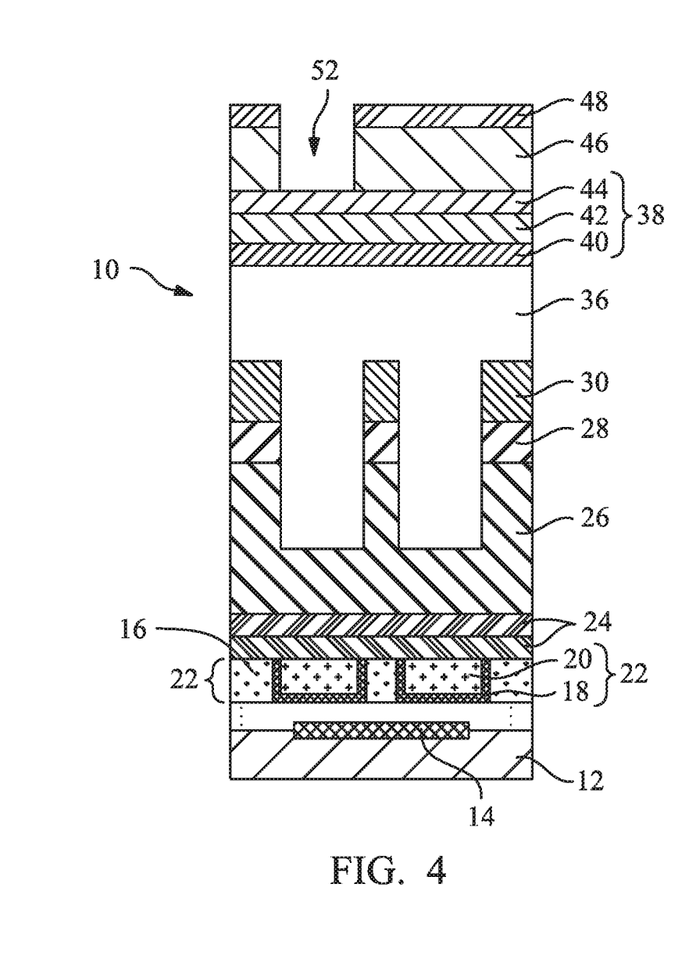
Figure 5:
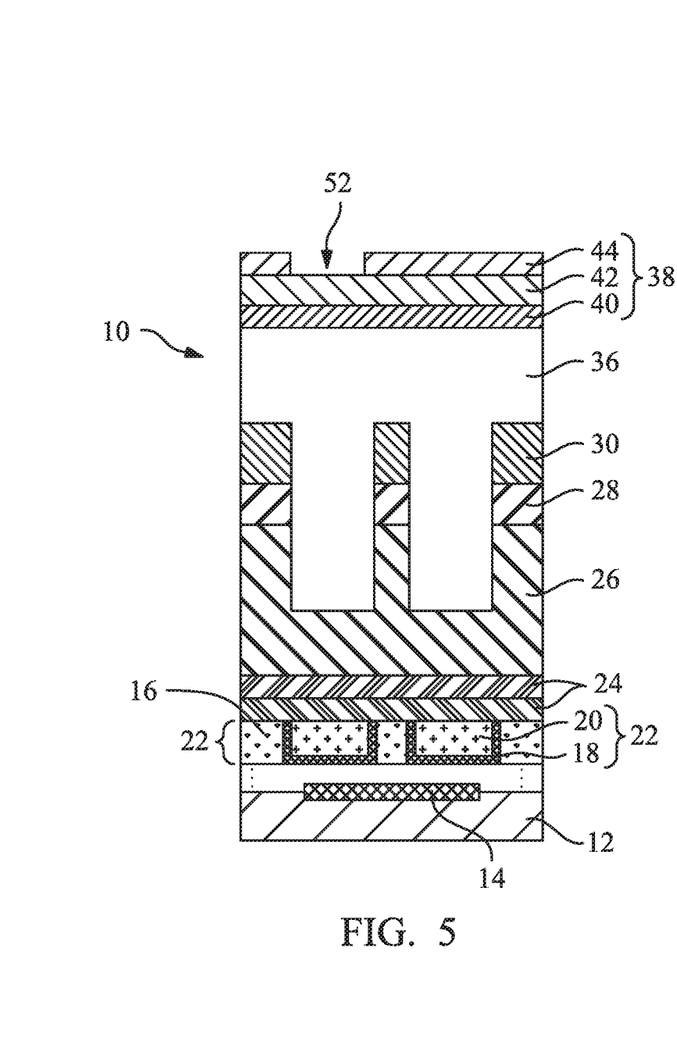

FIGS. 3 through 8 illustrate a two-photo-two-etching process for forming via patterns. FIGS. 3 through 5 illustrate the intermediate stages in a first-photo-first-etching process for forming a first via pattern. In accordance with some embodiments of the present disclosure, a tri-layer is formed over layers 38, which tri-layer includes bottom layer (also known as under layer) 46, middle layer 48 over bottom layer 46, and upper layer 50 over middle layer 48. The respective step is shown as step 210 in the process flow illustrated in FIG. 15. In accordance with some embodiments, bottom layer 46 and upper layer 50 are formed of photo resists. Middle layer 48 may be formed of an inorganic material, which may be a nitride (such as silicon nitride), an oxynitride (such as silicon oxynitride), an oxide (such as silicon oxide), or the like. Middle layer 48 has a high etching selectivity with relative to upper layer 50 and bottom layer 46, and hence upper layer 50 may be used as an etching mask for patterning middle layer 48, and middle layer 48 may be used as an etching mask for patterning bottom layer 46. Upper layer 50 is patterned to form opening 52, which has the pattern of via 70A (FIG. 13) that is to be formed in low-k dielectric layer 26.

Next, middle layer 48 is etched using the patterned upper layer 50 as an etching mask, so that the pattern of upper layer 50 is transferred to middle layer 48. The resulting structure is shown in FIG. 4. During the patterning of middle layer 48, upper layer 50 is at least partially, or entirely, consumed. After middle layer 48 is etched through, bottom layer 46 is patterned, wherein middle layer 48 is used as an etching mask. Upper layer 50 will also be fully consumed during the patterning of bottom layer 46 if it has not been fully consumed in the patterning of middle layer 48.

Bottom layer 46 and the overlying middle layer 48 are then used as an etching mask to etch the underlying layer 44, which etching process is referred to as the first etching process. The respective step is shown as step 212 in the process flow illustrated in FIG. 15. Opening 52 thus extends into layer 44, with layer 42 exposed to opening 52. Since middle layer 48 and layer 44 are both formed of inorganic materials, and may have a low etching selectivity with relative to each other, middle layer 48 may be consumed, and bottom layer 46 acts as the etching mask in the subsequent etching of layer 44. During the patterning of layer 44, bottom layer 46 is also consumed, although at a lower etching rate than middle layer 48 and layer 44. Hence, at the time the patterning of layer 44 is finished, the thickness of bottom layer 46 is reduced.

After the etching, the remaining bottom layer 46, which comprises photo resist, is removed in an ashing process, wherein oxygen is used to remove bottom layer 46. The resulting structure is shown in FIG. 5. As shown in FIGS. 4 and 5, low-k dielectric layer 26 and photo resist 36 are not damaged in the ashing process due to the protection provided by layers 40 and 42.

Figure 6:
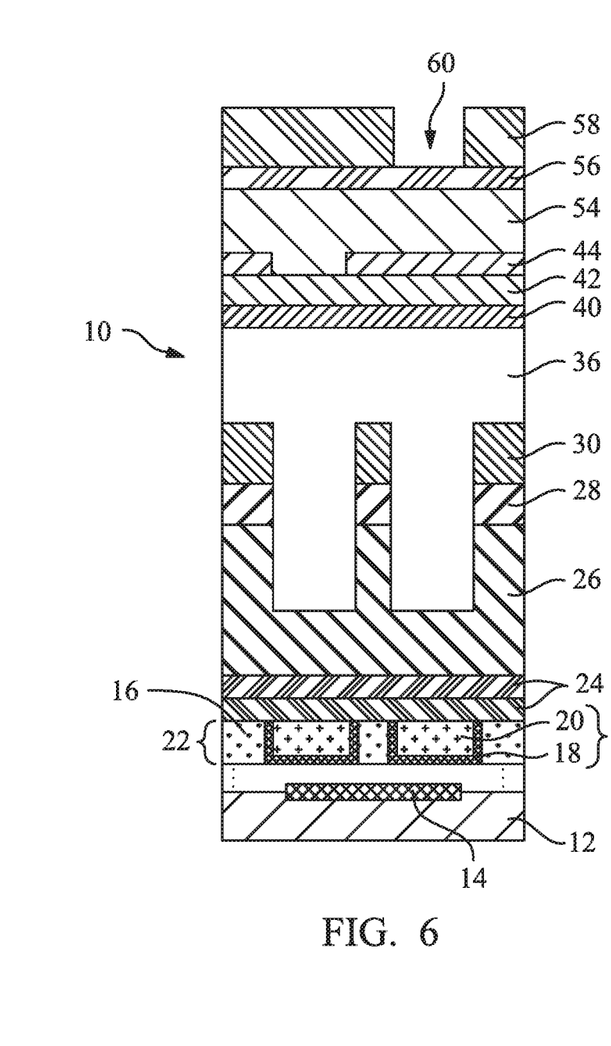
Figure 7:
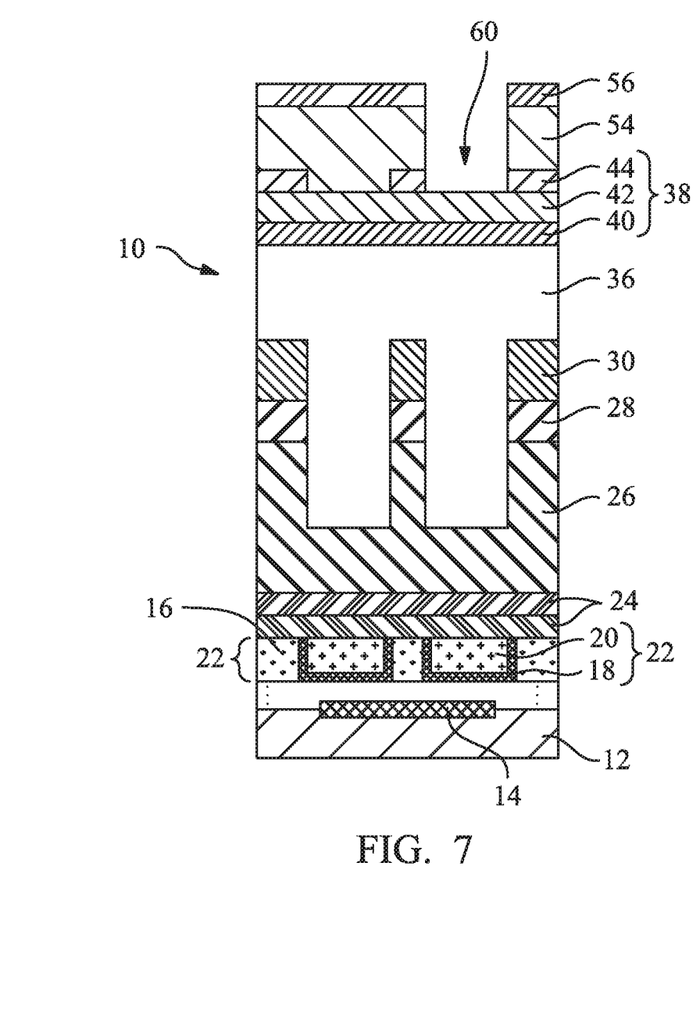
Figure 8:
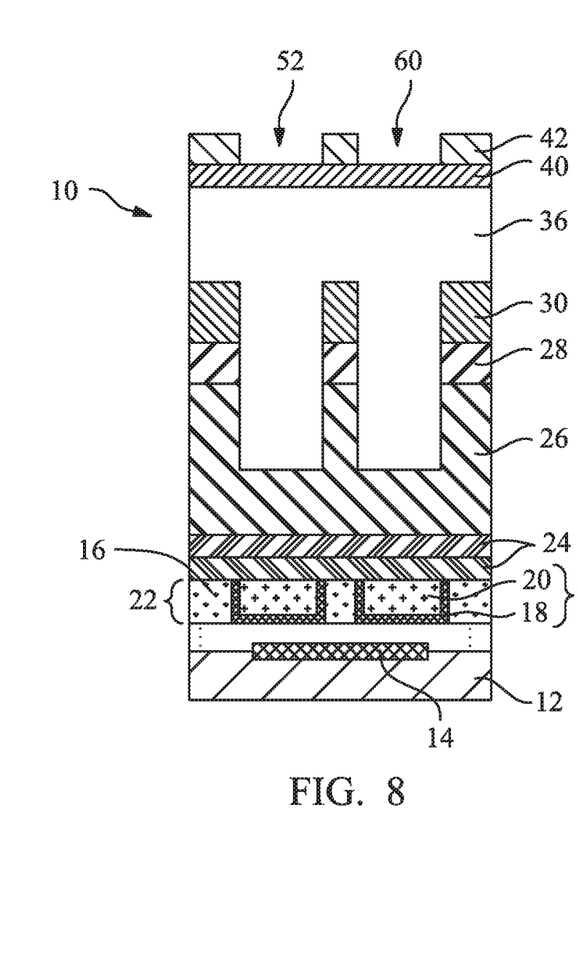

FIGS. 6 through 8 illustrate the second-photo-second-etching process in the patterning of layer 44. In accordance with some embodiments of the present disclosure, as shown in FIG. 6, a second tri-layer is formed over layer 44. The respective step is shown as step 214 in the process flow illustrated in FIG. 15. The second tri-layer includes bottom layer 54, middle layer 56 over bottom layer 54, and upper layer 58 over middle layer 56. In accordance with some embodiments, bottom layer 54 and upper layer 58 are formed of photo resists. Middle layer 56 may be formed of an inorganic material, which may be a nitride (such as silicon nitride), an oxynitride (such as silicon oxynitride), an oxide (such as silicon oxide), or the like. Middle layer 56 has a high etching selectivity with relative to upper layer 58 and bottom layer 54, and hence upper layer 58 may be used as an etching mask for patterning middle layer 56, and middle layer 56 may be used as an etching mask for patterning bottom layer 54. Upper layer 58 is patterned to form opening 60, which also has the pattern of via 70B (FIG. 13) that is to be formed in low-k dielectric layer 26.

Middle layer 56 is etched using the patterned upper layer 58 as an etching mask, so that the pattern of upper layer 58 is transferred to middle layer 56. The resulting structure is shown in FIG. 7. During the patterning of middle layer 56, upper layer 58 may also be consumed. After middle layer 56 is etched through, bottom layer 54 is patterned, followed by the etching of layer 44. Opening 60 thus extends into layer 44, with layer 42 exposed to opening 60. The respective step is shown as step 216 in the process flow illustrated in FIG. 15. After the etching, the remaining bottom layer 54 (FIG. 7), which comprises photo resist, is removed in an ashing process, wherein oxygen is used to remove bottom layer 54. The resulting structure is shown in FIG. 8. As shown in FIGS. 7 and 8, low-k dielectric layer 26 and photo resist 36 are not damaged in the ashing process due to the protection provided by layers 40 and 42.

Figure 9:
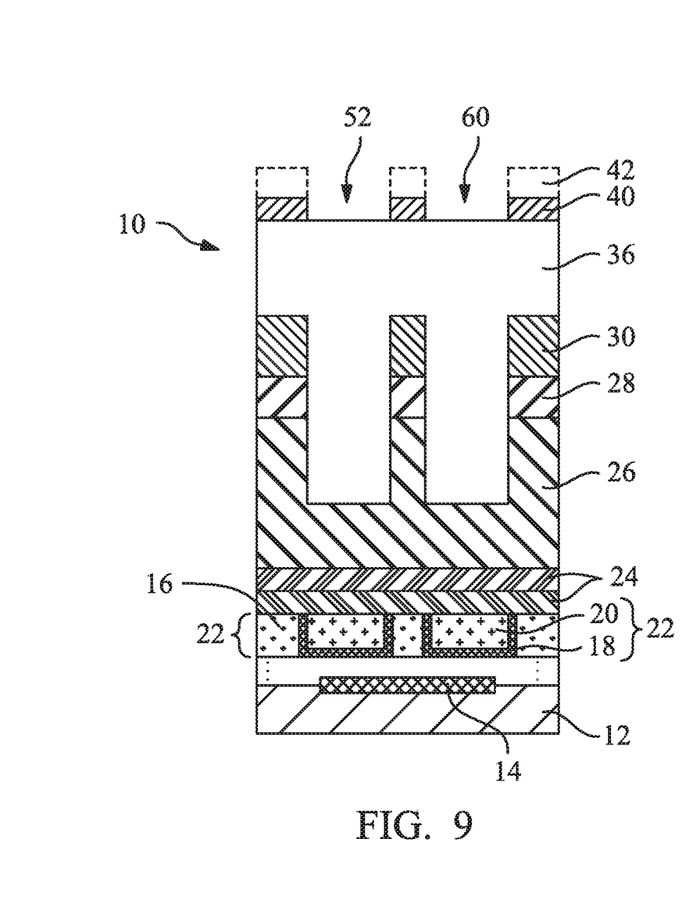
Figure 10:
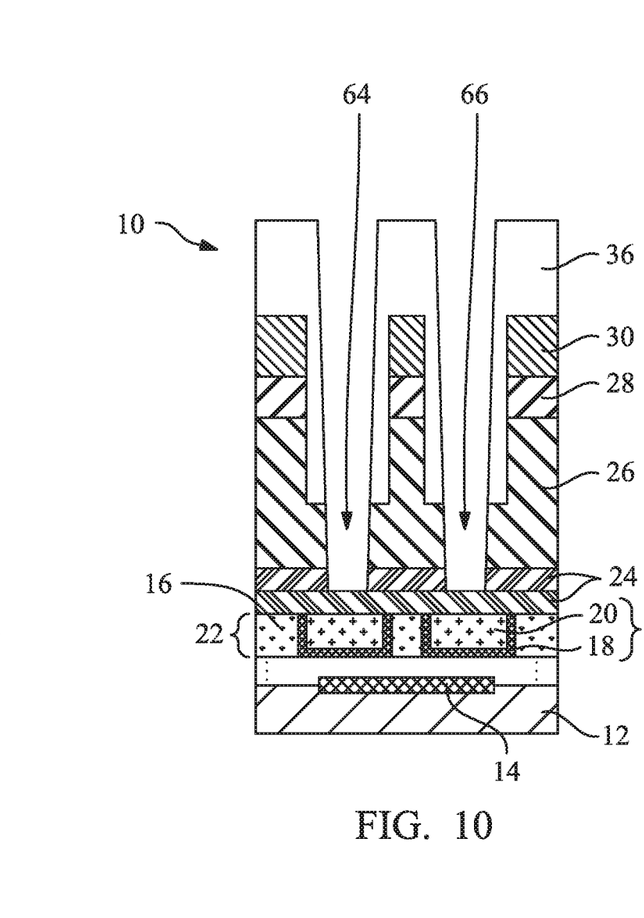
Figure 11:
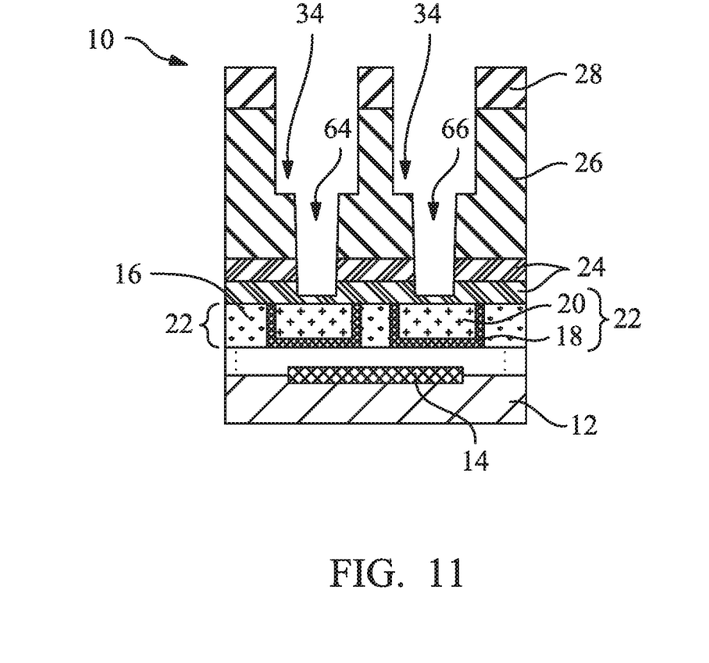

FIGS. 9 and 10 illustrate the transferring of via patterns into low-k dielectric layer 26. The respective step is shown as step 218 in the process flow illustrated in FIG. 15. Referring to FIG. 9, layer 42 (FIG. 8) is used as an etching mask to etch the underlying layer 40. In accordance with some embodiments of the present disclosure, hard mask layer 42 is removed after the etching, leaving patterned layer 40 as shown in FIG. 9. In accordance with alternative embodiments, after the patterning of layer 40, hard mask layer 42 (FIG. 8) is left unremoved, as shown by dashed lines in FIG. 9.

In a subsequent step, as shown in FIG. 10, photo resist 36 is etched, wherein layer 40 (or layer 42 if not removed) used as an etching mask. The etching of photo resist 36 stops on the top surface of low-k dielectric layer 26. Photo resist 36 is then used as an etching mask to etch low-k dielectric layer 26, so that via openings 64 and 66 are formed in the lower part of low-k dielectric layer 26. The etching is performed until ESL 24 is exposed. When ESL 24 includes more than one layer, the top layer of ESL 24 may also be etched through, and the etching stops on the bottom layer of ESL 24.

After the formation of via openings 64 and 66, the remaining photo resist 36 is removed in an ashing process, for example, through ashing using oxygen ($O_2$) as a process gas. Mask layer 30 is then etched, resulting in the structure in FIG. 11.

In accordance with some embodiments, as shown in FIGS. 3 through 8, the patterns formed in the first-photo-first-etching and the second-photo-second-etching are conserved in a layer (layer 44, FIG. 8) over photo resist 36, rather than formed directly in low-k dielectric layer 26. Accordingly, the formation of via openings 64 and 66 in low-k dielectric layer 26 only involves a single ashing process of photo resist 36. This is different from the conventional 2P2E processes, in which the formation of via openings in each of the 2P2E processes involves etching into low-k dielectric layer directly, and hence a photo resist needs to be formed for each of the 2P2E processes. As a result, the conventional 2P2E processes requires the ashing of two photo resists, and the exposure of the low-k dielectric layer to two ashing processes. Since the ashing process causes the damage of low-k dielectric layer, by adopting a single ashing process, the damage of the low-k dielectric layer is minimized in accordance with the embodiments of the present disclosure.

Figure 12:
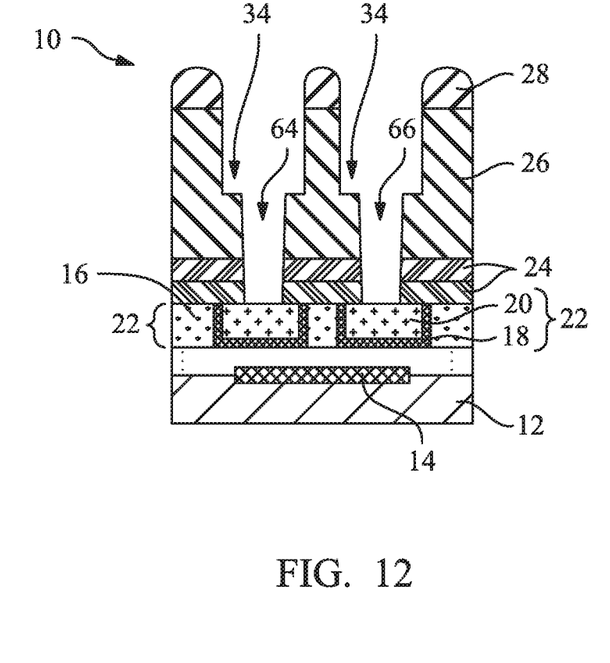
Figure 13:
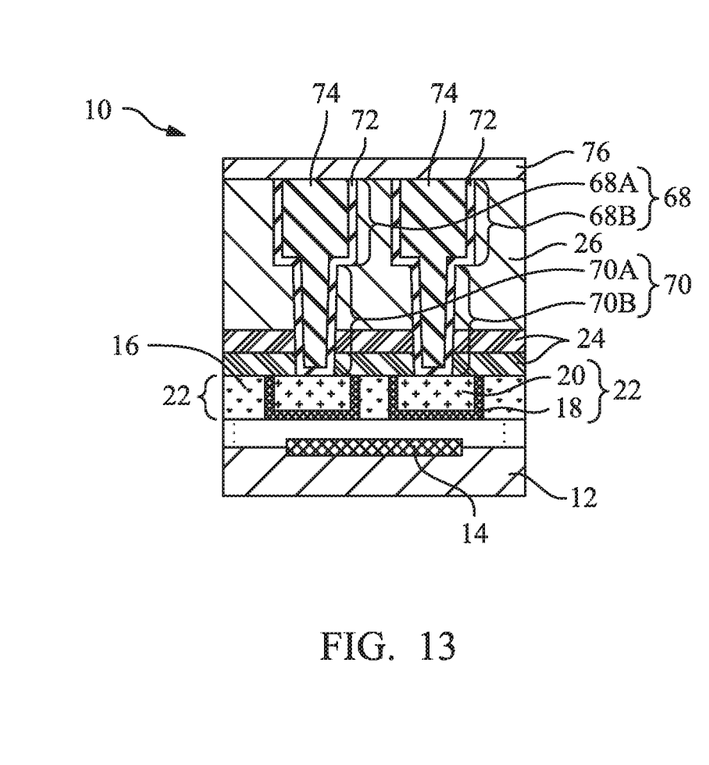

Referring to FIG. 12, etch stop layer 24 is etched through, revealing the underlying conductive lines 22. FIG. 13 illustrates the formation of conductive vias 70 (including 70A and 70B) in via openings 64 and 66 (FIG. 12), respectively. Conductive lines 68 (including 68A and 68B) are also formed in trenches 34 (FIG. 12). The respective step is shown as step 220 in the process flow illustrated in FIG. 15. Vias 70 and conductive lines 68 may include liners 72, such as diffusion barrier layers, adhesion layers, or the like. Liners 72 may be formed of titanium, titanium nitride, tantalum, tantalum nitride, or other alternatives. The inner material 74 of conductive lines 68 includes a conductive material such as copper, a copper alloy, silver, gold, tungsten, aluminum, or the like. In accordance with some embodiments, the formation of vias 70 and conductive lines 68 includes performing a blanket deposition to form liner 72, depositing a thin seed layer of copper or copper alloy, and filling the rest of via openings 64/66 and trenches 34 with metal 74, for example, through electro-plating, electro-less plating, deposition, or the like. A planarization such as Chemical Mechanical Planarization (CMP) may be performed to level the surface of conductive lines 68, and to remove excess conductive materials from the top surface of dielectric layer 26. In subsequent steps, dielectric ESL layer 76 is formed, and more low-k dielectric layers and metal lines and vias (not shown) may be formed.

In accordance with some embodiments, the process steps as discussed may be used on three-photo-three-etching processes. In these embodiments, a third-photo-third-etching may be performed to form the pattern of a third via in layer 44, wherein the third pattern is simultaneously transferred down to low-k dielectric layer 26 as openings 52 and 60 (FIG. 8). The third-photo-third-etching may be inserted between the step shown in FIG. 8 and the step shown in FIG. 9. The process steps of the third-photo-third-etching are similar to the steps shown in FIGS. 6 through 8, and hence are not repeated herein.

Figure 14:
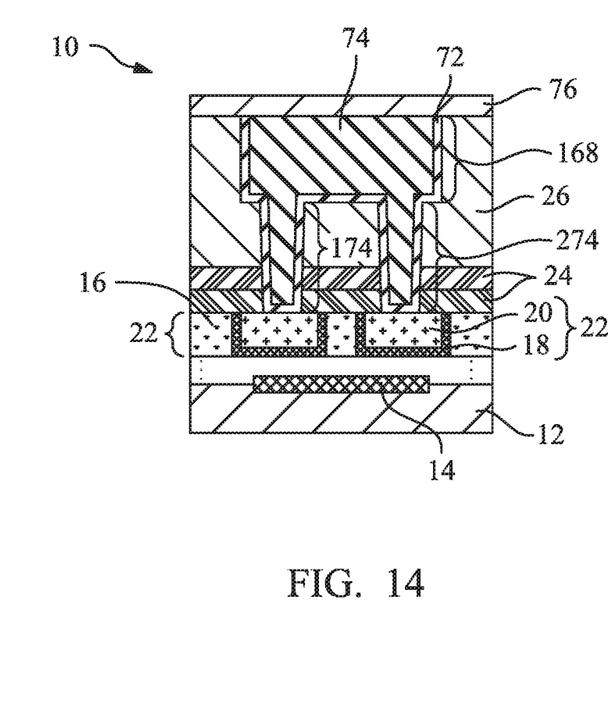
FIG. 14 illustrates the cross-sectional view of an integrated circuit structure including two vias underlying and connected to the same metal line in accordance with some embodiments.

The process steps shown in FIGS. 1 through 13 illustrate the formation of two vias, each connected to its own overlying metal lines. The same process steps may also be used for forming vias that are directly underlying, and connected to the same overlying metal line. The process steps are performed simultaneously, and share the process steps shown in FIGS. 1 through 13, with no additional process steps added. For example, FIG. 14 illustrates a structure including vias 174 and 274, which are formed using 2P2E processes. Vias 174 and 274 are underlying and connected to the same overlying conductive line 168. Furthermore, the pattern of via 174 is defined simultaneously, and by the same process steps 3-5, as defining the pattern of via 70A in FIG. 13, and the pattern of via 274 is defined simultaneously, and by the same process steps 6-8, as defining the pattern of via 70B in FIG. 13.

The embodiments of the present disclosure have some advantageous features. In accordance with some embodiments of the present disclosure, a mask layer is used for conserving the patterns formed in 2P2E (or 3P3E) processes. The patterns are then simultaneously transferred into the low-k dielectric layer. Accordingly, regardless of how many photo-and-etching steps are used, the formation of the vias and metal lines only involves a single photo resist layer whose ashing may cause the damage of the low-k dielectric layer. The ashing of the photo resists in the 2P2E process does not result in the damage of the low-k dielectric layer since the low-k dielectric layer is protected by the overlying photo resist and mask layers. In addition, through the 2P2E processes, the corners where vias join the overlying metal line(s) have sharp profiles, rather than being adversely rounded.

In accordance with some embodiments of the present disclosure, a method includes forming a dielectric layer, forming a photo resist over the dielectric layer, forming a first mask layer over the photo resist, and forming a second mask layer over the first mask layer. A first-photo-first-etching is performed to form a first via pattern in the second mask layer, wherein the first-photo-first-etching stops on a top surface of the first mask layer. A second-photo-second-etching is performed to form a second via pattern in the second mask layer, wherein the second-photo-second-etching stops on the top surface of the first mask layer. The first mask layer is etched using the second mask layer as an etching mask. The photo resist and the dielectric layer are etched to simultaneously transfer the first via pattern and the second via pattern into the dielectric layer.

In accordance with some embodiments of the present disclosure, a method includes forming a low-k dielectric layer over a substrate, etching the low-k dielectric layer to form a trench, forming a first mask layer over the low-k dielectric layer, and forming a second mask layer over the first mask layer. The method further includes, in a first patterning step, forming a first via pattern in the second mask layer, and in a second patterning step, forming a second via pattern in the second mask layer. The first mask layer is etched using the second mask layer as an etching mask to simultaneously transfer the first via pattern and the second via pattern into the first mask layer. The low-k dielectric layer is etched using the first mask layer as an etching mask to form a first via opening and a second via opening in the low-k dielectric layer.

In accordance with some embodiments of the present disclosure, a method includes forming a low-k dielectric layer over a semiconductor substrate, etching the low-k dielectric layer to form a first trench and a second trench, applying a photo resist having a first portion filling the first trench and a second portion filling the second trench, forming a first mask layer covering the photo resist, and forming a second mask layer overlying the first mask layer. The first mask layer is a planar blanket layer. A first via opening and a second via opening are formed in the second mask layer using separate process steps. When the first via opening and the second via opening are formed, the photo resist is fully covered by the first mask layer. The first mask layer is etched to extend the first via opening and the second via opening into the first mask layer. The first via opening and the second via opening are extended into the first portion and the second portion, respectively, of the photo resist. The low-k dielectric layer is etched using the photo resist as an etching mask to form a first via opening and a second via opening, respectively, in the low-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a dielectric layer;
forming a trench in the dielectric layer;
dispensing a filling material, wherein the filling material comprises a first portion filling the trench;
etching the filling material;
etching the dielectric layer to form a via opening in the dielectric layer, wherein a portion of the filling martial acts as a part of an etching mask, and the via opening penetrates through a first etch stop layer underlying the dielectric layer;
removing the filling material; and
after the filling material is removed, etching-through a second etch stop layer underlying the first etch stop layer to expose a conductive feature.

2. The method of claim 1, wherein when the dielectric layer is etched to form the via opening, a top surface of the filling material is exposed.

3. The method of claim 1 further comprising:
forming an additional etching mask over the dielectric layer, wherein the trench is formed using the etching mask.

4. The method of claim 3, wherein when the second etch stop layer is etched-through, the etching mask protects a portion of the dielectric layer.

5. The method of claim 1, wherein the filling material further comprises a second portion over the dielectric layer, wherein in the etching the filling material, the second portion of the filling material is etched-through.

6. The method of claim 1 further comprising:
depositing a first oxide layer over the filling material;
depositing a hard mask layer over the first oxide layer; and
depositing a second oxide layer over the hard mask layer.

7. The method of claim 6 further comprising:
patterning the second oxide layer, the hard mask layer, and the first oxide layer, wherein the first oxide layer is used as a part of an additional etching mask in the etching the filling material.

8. The method of claim 1, wherein the filling material comprises a photo resist.

9. A method comprising:
forming a dielectric layer;
forming a trench in an upper portion of the dielectric layer;
applying a filling material comprising a first portion over the dielectric layer, and a second portion filling the trench;
performing a first etching process to etch the filling material, wherein an opening is formed in the filling material, and wherein the first etching process stops on a lower sub-layer of an etch stop layer underlying the dielectric layer;
removing the filling material; and
etching-through the lower sub-layer of the etch stop layer.

10. The method of claim 9, wherein the etching the filling material comprises an anisotropic etching.

11. The method of claim 9 further comprising:
after the lower sub-layer of the etch stop layer is etched, forming a metal line and a via in the trench and a via opening, respectively.

12. The method of claim 9, wherein the etch stop layer further comprises an upper sub-layer over the lower sub-layer, wherein the upper sub-layer is etched-through in the first etching process.

13. The method of claim 9 further comprising:
depositing a first oxide layer over and contacting the filling material;
depositing a hard mask layer over and contacting the first oxide layer;
depositing a second oxide layer over and contacting the hard mask layer; and
patterning the second oxide layer, the hard mask layer, and the first oxide layer, wherein the filling material is etched using the hard mask layer and the first oxide layer that have been patterned as an etching mask.

14. The method of claim 13, wherein the patterning the second oxide layer is performed using a double-patterning process, with the first oxide layer and the hard mask layer preserving patterns formed in two different etching processes of the double-patterning process.

15. The method of claim 9, wherein the opening formed by the first etching process is underlying and connected to the trench, and is narrower than the trench.

16. The method of claim 9, wherein the filling material comprises a photo resist.

17. A method comprising:
etching an upper portion of a dielectric layer to form a trench, wherein a bottom of the trench is at a level between a top surface and a bottom surface of the dielectric layer;
filling a sacrificial layer into the trench;
patterning the sacrificial layer;
etching a lower portion of the dielectric layer using the sacrificial layer that has been patterned as an etching mask, wherein a via opening is formed in the lower portion of the dielectric layer, and wherein:

an upper sub-layer of an etch stop layer underlying the dielectric layer is etched-through; and a lower sub-layer of the etch stop layer is exposed;

removing the sacrificial layer; and etching-through the lower sub-layer of the etch stop layer.

18. The method of claim 17, wherein the sacrificial layer comprises a photo resist.

19. The method of claim 17 further comprising:

form a conductive line and a via in the trench and the via opening, respectively.

20. The method of claim 17, wherein when the lower portion of the dielectric layer is etched, a top surface of the sacrificial layer is exposed.

\* \* \* \* \*